United States Patent
Horie et al.

(10) Patent No.: US 9,523,849 B2
(45) Date of Patent: Dec. 20, 2016

(54) OPTICAL REFLECTION ELEMENT

(71) Applicant: PANASONIC CORPORATION, Osaka (JP)

(72) Inventors: Toshiaki Horie, Osaka (JP); Soichiro Hiraoka, Hyogo (JP); Shinsuke Nakazono, Osaka (JP); Kazuki Komaki, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 14/388,213

(22) PCT Filed: Apr. 24, 2013

(86) PCT No.: PCT/JP2013/002770
§ 371 (c)(1),
(2) Date: Sep. 25, 2014

(87) PCT Pub. No.: WO2013/168385
PCT Pub. Date: Nov. 14, 2013

(65) Prior Publication Data
US 2015/0323783 A1    Nov. 12, 2015

(30) Foreign Application Priority Data
May 7, 2012    (JP) .................. 2012-105720

(51) Int. Cl.
*G02B 26/08*    (2006.01)
*G02B 26/10*    (2006.01)
*B81B 3/00*    (2006.01)

(52) U.S. Cl.
CPC ......... *G02B 26/0858* (2013.01); *B81B 3/0043* (2013.01); *G02B 26/10* (2013.01);
(Continued)

(58) Field of Classification Search
CPC . G02B 26/101; G02B 26/105; G02B 26/0858; G02B 26/0833; G02B 26/10
(Continued)

(56) References Cited

U.S. PATENT DOCUMENTS

2005/0219674 A1 * 10/2005 Asai .................. G02B 26/0833
                                                                 359/213.1
2008/0165402 A1   7/2008 Nakamura et al.
(Continued)

FOREIGN PATENT DOCUMENTS

CN    101750734    6/2010
CN    101221283 B    10/2011
(Continued)

OTHER PUBLICATIONS

International Search Report issued in International Application No. PCT/JP2013/002770 with Date of mailing May 28, 2013, with English Translation.
(Continued)

*Primary Examiner* — Scott J Sugarman
*Assistant Examiner* — Alberto Betancourt
(74) *Attorney, Agent, or Firm* — McDermott Will & Emery LLP (57) ABSTRACT

An optical reflecting device includes a mirror part, a pair of joints, a pair of vibration parts, a plurality of driving parts, and a fixed part. Each of the joints has a first end connected to respective one the facing positions to each other on the mirror part and a second end opposite to the first end, and extends along a first axis. Each of the vibration parts has a central portion connected to the second end of respective one of the joints. A plurality of driving parts are disposed in each of the pair of vibration parts, and rotate the mirror part. Both ends of each of the pair of vibration parts are connected to the fixed part. The beam width defined as the length of
(Continued)

each of the joints in a direction orthogonal to the first axis is greater than the beam width of each of the pair of vibration parts.

12 Claims, 10 Drawing Sheets

(52) U.S. Cl.
CPC ...... *G02B 26/105* (2013.01); *B81B 2201/032* (2013.01); *B81B 2201/042* (2013.01); *B81B 2203/0163* (2013.01); *G02B 26/0833* (2013.01); *G02B 26/101* (2013.01)

(58) Field of Classification Search
USPC .................. 359/199.4, 200.8, 200.2, 202.1, 221.2,359/223.1–224.1; 310/311
See application file for complete search history.

(56) References Cited

U.S. PATENT DOCUMENTS

2009/0185254 A1    7/2009   Uchigaki et al.
2009/0225384 A1    9/2009   Eiji et al.
2010/0142023 A1    6/2010   Kanno et al.
2010/0149615 A1    6/2010   Kotera et al.

FOREIGN PATENT DOCUMENTS

| JP | 2004-177543 | 6/2004 |
| JP | 4285568 B2 | 6/2009 |
| JP | 2009-222900 A | 10/2009 |
| JP | 2010-139977 A | 6/2010 |
| WO | 2008/038545 A1 | 4/2008 |

OTHER PUBLICATIONS

English Translation of Chinese Search Report dated Mar. 23, 2016 for the related Chinese Patent Application No. 201380023796.6.

\* cited by examiner

OPTICAL REFLECTION ELEMENT

RELATED APPLICATIONS

This application is a national phase of International Application No. PCT/JP2013/002770, filed on Apr. 24, 2013, which in turn claims the benefit of Japanese Application No. 2012-105720, filed on May 7, 2012, the disclosures of which Applications are incorporated by reference herein.

TECHNICAL FIELD

The present invention relates to an optical reflecting device used in an image projection device such as a head-up display and a head-mounted display.

BACKGROUND ART

Recently, an optical reflecting device for scanning with a laser beam and projecting an image on a screen or the like using a micro electro mechanical systems (MEMS) technology has been developed. In order to project an image, a two-dimensional scan with a laser beam needs to be performed using the optical reflecting device. As a method of driving the optical reflecting device, a piezoelectric actuator is employed, for example.

Figure 10:
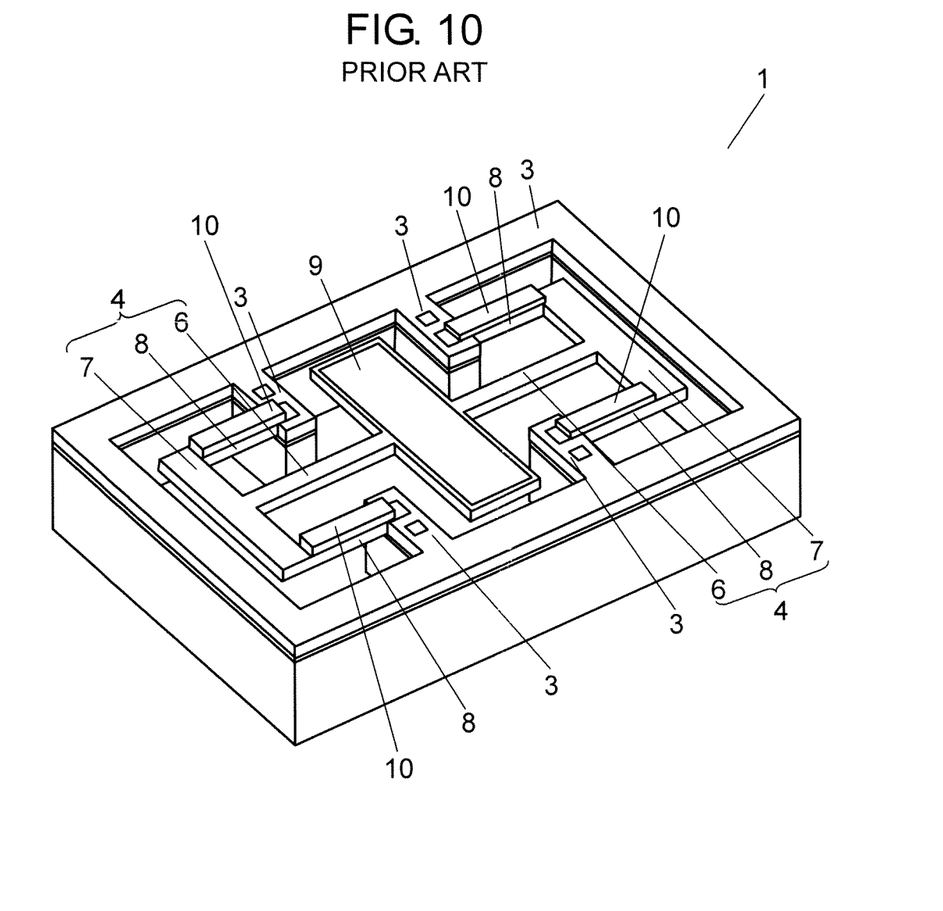
FIG. 10 is a perspective view of a conventional optical reflecting device.

FIG. 10 is a perspective view of conventional optical reflecting device 1. Optical reflecting device 1 includes mirror part 9, fixed part 3 supporting mirror part 9, a pair of vibrating beams 4, and piezoelectric layers 10 for rotating mirror part 9. Each vibrating beam 4 couples mirror part 9 to fixed part 3 so that mirror part 9 rotates with respect to fixed part 3. When piezoelectric layers 10 are energized, they expand or contract. Due to this expansion or contraction, vibrating beams 4 are twisted to rotate mirror part 9.

Each vibrating beam 4 includes torsion bar 6 extending from mirror part 9, driving member 7, and a pair of elastic members 8. Driving member 7 is connected to the end of torsion bar 6 on the opposite side to mirror part 9. The pair of elastic members 8 are disposed closer to mirror part 9 than driving member 7, and face each other via the rotation center axis of mirror part 9. A first end of each elastic member 8 is connected to driving member 7, and a second end thereof is connected to a part of fixed part 3. The piezoelectric actuator of this application is disclosed by Patent Literature 1, for example.

CITATION LIST

Patent Literature

PTL 1 Japanese Patent No. 4285568

SUMMARY OF THE INVENTION

The present invention provides a small-sized optical reflecting device capable of achieving a large displacement and a high-frequency drive. The optical reflecting device of the present invention includes a mirror part, a pair of joints, a pair of vibration parts, a plurality of driving parts, and a fixed part. Each of the joints has a first end connected to respective one of the facing positions to each other on the mirror part and a second end opposite to the first end, and extends along a first axis. Each of the vibration parts has a central portion connected to the second end of respective one of the joints. The plurality of driving parts are disposed in each of the pair of vibration parts, and configured to rotate the mirror part. Both ends of each of the vibration parts are connected to the fixed part. A beam width defined as the length of each of the joints in a direction orthogonal to the first axis is greater than the beam width of each of the vibration parts.

In this configuration, the stress applied to the joints can be reduced to increase the mechanical strength, so that the mirror part can be driven at a high frequency by a large rotation angle (displacement).

DESCRIPTION OF EMBODIMENTS

Prior to the description of the exemplary embodiments of the present invention, problems of conventional optical reflecting device 1 are described briefly. In order to increase the resolution of a projected image, it is required that the driving frequency is increased to increase the scan rate of a light flux (light spot) while the rotation angle of mirror part 9 is kept. At this time, stress concentrates to torsion bar 6, so that torsion bar 6 needs to be extended to disperse the stress. As a result, optical reflecting device 1 is enlarged and the scan rate is decreased.

Hereinafter, the optical reflecting devices of the exemplary embodiments of the present invention will be described hereinafter with reference to the accompanying drawings.

First Exemplary Embodiment

Figure 1:
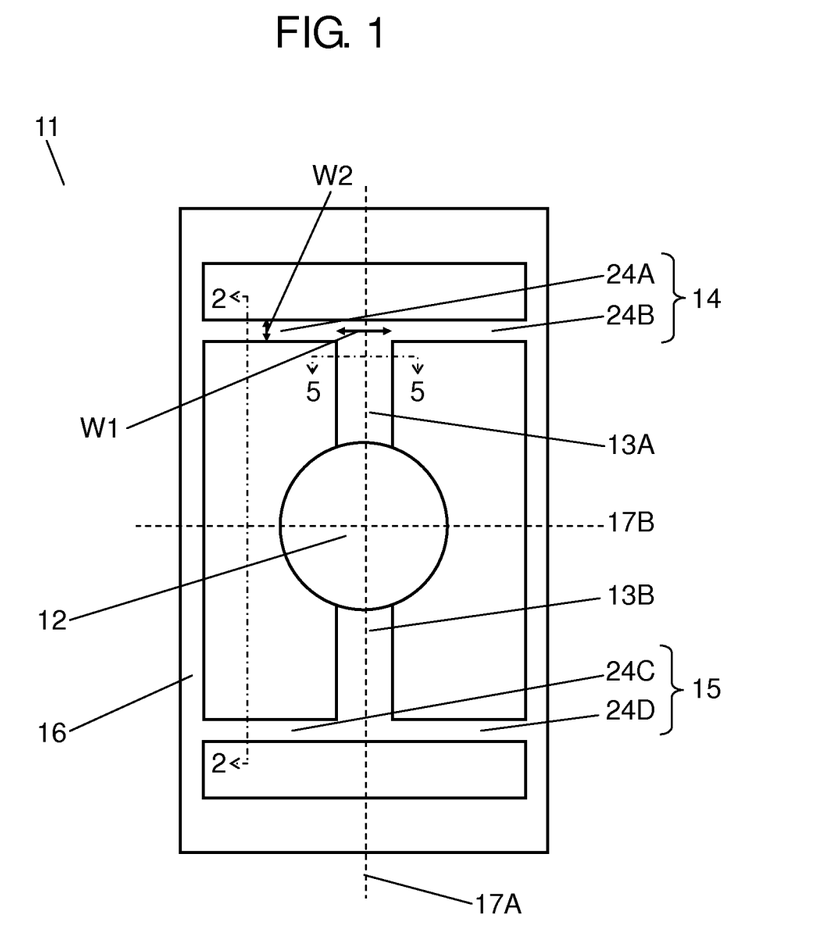
FIG. 1 is a plan view of an optical reflecting device in accordance with a first exemplary embodiment of the present invention.

FIG. 1 is a plan view of optical reflecting device 11 in accordance with a first exemplary embodiment of the present invention. Optical reflecting device 11 includes mirror part 12, a pair of joints 13A and 13B, a pair of vibration parts 14 and 15, a plurality of driving parts 24A, 24B, 24C, and 24D, and fixed part 16. Joints 13A and 13B are extended along first axis 17A, and face each other so as to sandwich mirror part 12. In other words, the first ends of joints 13A and 13B are connected to mirror part 12 at facing positions to each other on mirror part 12, and support mirror part 12. Vibration parts 14 and 15 sandwich joints 13A and 13B at the central portions thereof, and are connected to the second ends of joints 13A and 13B. Vibration parts 14 and 15 are extended along second axis 17B orthogonal to first axis 17A. Frame-shaped fixed part 16 is connected to both ends of each of vibration parts 14 and 15, and supports vibration parts 14 and 15. Fixed part 16 may be formed of two or more components or does not need to have a frame shape as long as fixed part 16 supports vibration parts 14 and 15.

Driving parts 24A and 24B are disposed on the opposite sides with respect to the central portion of vibration part 14, and driving parts 24C and 24D are disposed on the opposite sides with respect to the central portion of vibration part 15. Driving parts 24A to 24D rotate mirror part 12 around first axis 17A serving as the center axis. Driving parts 24A to 24D have a straight shape extended in the second axis 17B direction, or a curved shape.

Figure 2:
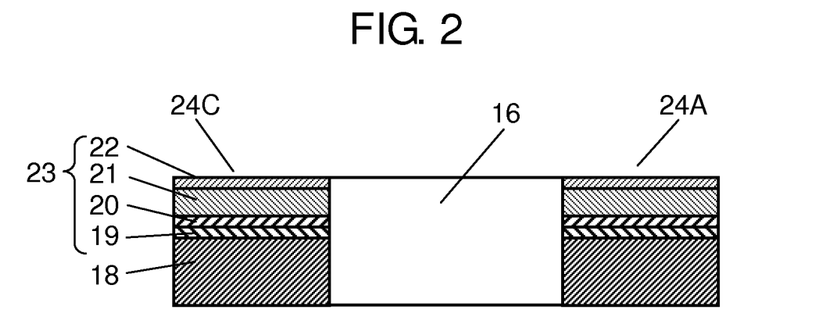
FIG. 2 is a sectional view of the optical reflecting device taken along the line 2-2 shown in FIG. 1.

Next, the configurations of driving parts 24A to 24D are described with reference to FIG. 2. FIG. 2 is a sectional view taken along the line 2-2 shown in FIG. 1. Driving parts 24A and 24C forming vibration parts 14 and 15 have, as the lowest layer, silicon substrate 18 formed integrally over whole optical reflecting device 11, and have insulating film 19 on silicon substrate 18. Lower electrode film 20 is disposed on insulating film 19, piezoelectric film 21 is disposed on lower electrode film 20, and upper electrode film 22 is disposed on piezoelectric film 21. Thus, piezoelectric layer 23 is formed of insulating film 19, lower electrode film 20, piezoelectric film 21, and upper electrode film 22.

Lower electrode film 20 and upper electrode film 22 are formed of a metal film such as platinum, gold, titanium, and tungsten, and piezoelectric film 21 is made of a piezoelectric material such as lead zirconate titanate $(Pb(Zr_{1-x},Ti_x)O_3)$. They can be produced as a thin film by vapor deposition, sol-gel method, CVD (chemical vapor deposition), spatter method, or the like. Driving parts 24B and 24D are configured similarly. In other words, driving parts 24A to 24D are produced by sequentially stacking lower electrode film 20, piezoelectric film 21, and upper electrode film 22.

When a predetermined voltage is applied between lower electrode film 20 and upper electrode film 22, piezoelectric film 21 expands or contracts in the plane direction of piezoelectric film 21 due to an inverse piezoelectric effect. Therefore, driving parts 24A to 24D each including piezoelectric film 21 are bent in the thickness direction.

When the phase of the voltage applied to driving part 24A is set opposite to that of the voltage applied to driving part 24B, driving parts 24A and 24B are bent in the opposite directions. Here, driving part 24B is disposed on the opposite side of joint 13A with respect to driving part 24A. As a result, joint 13A sandwiched between driving parts 24A and 24B is twisted.

Similarly to joint 13A, joint 13B is twisted when voltages of opposite phases are applied to driving parts 24C and 24D. When the voltages applied to driving parts 24A and 24C are set to have the same phase and the voltages applied to driving parts 24B and 24D are set to have the same phase, joints 13A and 13B are twisted in the same phase. As a result, mirror part 12 rotates around first axis 17A.

When natural vibration mode of causing a rotation operation around first axis 17A is used, mirror part 12 can be displaced significantly. Therefore, when a driving frequency synchronous with the resonance frequency is applied to driving parts 24A to 24D, mirror part 12 can be significantly displaced around first axis 17A as the center axis.

When mirror part 12 is displaced, joints 13A and 13B are twisted to generate the torsional stress. As the displacement of mirror part 12 increases, the torsional stress applied to joints 13A and 13B also increases. When the torsional stress exceeds the mechanical strength of joints 13A and 13B, a crack or the like occurs in joints 13A and 13B, and mirror part 12 cannot be displaced.

Generally, in order to increase the displacement of mirror part 12, the length of joints 13A and 13B is elongated in the direction along first axis 17A and the torsional stress applied to joints 13A and 13B is reduced. When joints 13A and 13B are extended along the first axis 17A, however, optical reflecting device 11 becomes large, and the resonance frequency as the scan rate decreases as discussed above.

While, in optical reflecting device 11, beam width W1 of joints 13A and 13B is greater than beam width W2 of vibration parts 14 and 15. Beam width W1 is defined as the length of joints 13A and 13B in the direction orthogonal to first axis 17A. While, beam width W2 is defined as the length of vibration parts 14 and 15 in the direction along first axis 17A.

Due to this size relation, in joints 13A and 13B, the bending by driving parts 24A to 24D is more dominant than the twist. In other words, the bending stress applied to the whole of each of joints 13A and 13B is more dominant than the torsional stress applied to the central portions of joints 13A and 13B. The stress is thus dispersed to the whole of joints 13A and 13B, so that the displacement of mirror part 12 can be kept while the stress does not exceed the mechanical strength of the material of joints 13A and 13B.

Increasing the beam width of joints 13A and 13B allows the total mass of mirror part 12 as a rotator and joints 13A and 13B to be increased. As a result, the resonance frequency of vertical vibration mode of mirror part 12 is decreased. While, the distance from the end of each of joints 13A and 13B parallel to first axis 17A to each end of mirror part 12 in the direction along second axis 17B becomes relatively short. Therefore, the moment of inertia of mirror part 12 around first axis 17A becomes relatively small. As a result, the resonance frequency of the vibration mode of rotating mirror part 12 around first axis 17A is increased. By adjusting the balance between the total mass and distance, the resonance frequency of the vibration mode can be increased.

Figure 3:
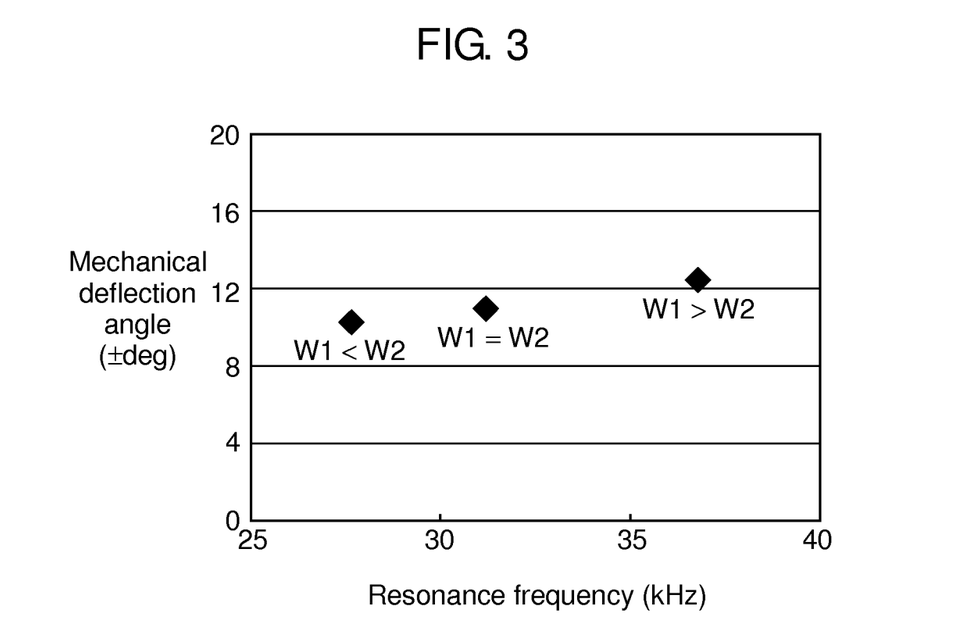
FIG. 3 is a diagram showing the relationship between the resonance frequency and mechanical deflection angle of the optical reflecting device shown in FIG. 1.

FIG. 3 shows the relationship between the resonance frequency and the mechanical deflection angle of mirror part 12 when beam width W1 of joints 13A and 13B is varied with respect to beam width W2 of vibration parts 14 and 15. The horizontal axis shows the resonance frequency, and the vertical axis shows the mechanical deflection angle. When beam width W1 of joints 13A and 13B is smaller than beam width W2 (170 μm) of vibration parts 14 and 15 by 50 μm, the resonance frequency and the mechanical deflection angle are decreased. On the other hand, when beam width W1 of joints 13A and 13B is greater than beam width W2 (170 μm) of vibration parts 14 and 15 by 100 μm, both of the resonance frequency and the mechanical deflection angle are increased and the trade-off relation can be avoided. Thus, by making beam width W1 of joints 13A and 13B greater than beam width W2 of vibration parts 14 and 15, the resonance frequency and the mechanical deflection angle can be increased simultaneously.

Figure 4:
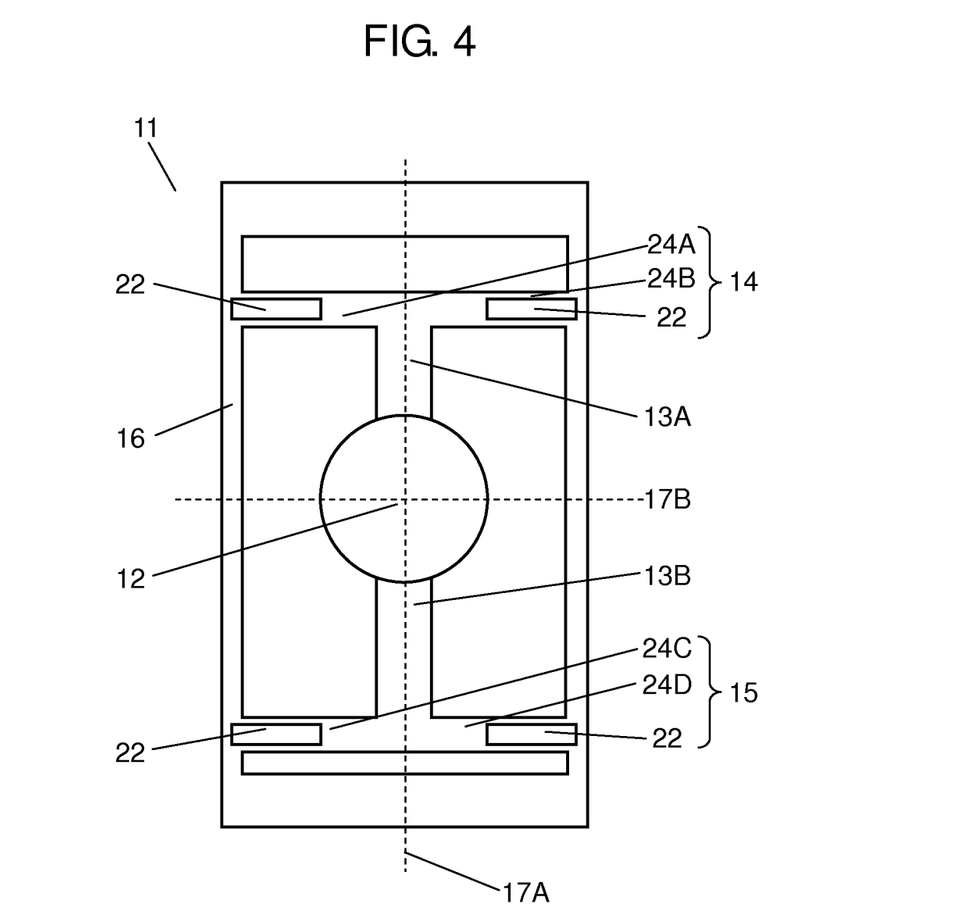
FIG. 4 is a layout drawing of electrode films in the optical reflecting device shown in FIG. 1.

Next, a preferable configuration of optical reflecting device 11 is described with reference to FIG. 4. FIG. 4 is a layout drawing of upper electrode films 22 in optical reflecting device 11.

As discussed above, each of driving parts 24A to 24D is provided with piezoelectric layer 23 for bending vibration parts 14 and 15. Therefore, piezoelectric layers 23 may simultaneously have a function of monitoring the driven states of vibration parts 14 and 15. In other words, piezoelectric film 21 has a piezoelectric effect, and hence generates a charge in response to the bending of each of driving parts 24A to 24D. The charge amount corresponding to the amount of bending is generated, so that, by monitoring the charge, the driven states of vibration parts 14 and 15 can be monitored accurately.

For this purpose, it is required that the driven states of vibration parts 14 and 15 are detected without disturbing the driving of them and the electrode film is disposed at a position at which distortion is apt to occur in piezoelectric film 21. Driving parts 24A to 24D bend, so that distortion is apt to be concentrated around fixed part 16. Therefore, as shown in FIG. 4, it is preferable that upper electrode film 22 be disposed on at least each of the boundary lines between fixed part 16 and each of vibration parts 14 and 15. In other words, it is preferable that upper electrode film 22 defining a monitor part be formed in each of the boundaries between fixed part 16 and each of vibration parts 14 and 15.

Figure 5:
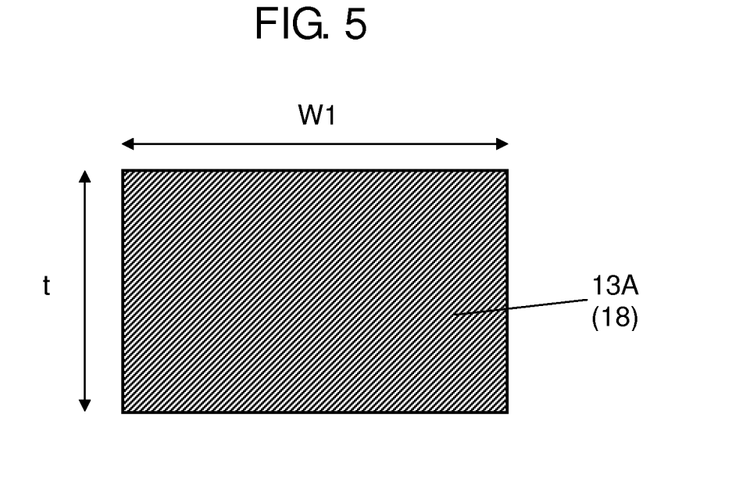
FIG. 5 is a sectional view of the optical reflecting device taken along the line 5-5 shown in FIG. 1.

Another preferable configuration of optical reflecting device 11 is described with reference to FIG. 5. FIG. 5 is a sectional view of the optical reflecting device taken along the line 5-5 shown in FIG. 1, and shows the cross section of joint 13A.

As shown, it is preferable that beam width W1 of each of joints 13A and 13B is greater than beam thickness t of each of joints 13A and 13B. Beam thickness t is defined as the length of each of joints 13A and 13B in the direction orthogonal to the plane formed of first axis 17A and second axis 17B. When beam width W1 is equal to or smaller than beam thickness t in joints 13A and 13B, the torsional stress applied to joints 13A and 13B is apt to be concentrated in side walls of joints 13A and 13B, and the effect of dispersing the stress in the plane direction by extending beam width W1 cannot be produced. When silicon substrate 18 is employed, a Bosch process is often used for processing silicon. When the Bosch process is used, however, an uneven shape called scallop occurs in the side walls. When the stress is concentrated in the uneven part, the mechanical strength is lowered. Thus, it is preferable that beam width W1 is greater than beam thickness t in joints 13A and 13B.

Second Exemplary Embodiment

Figure 6:
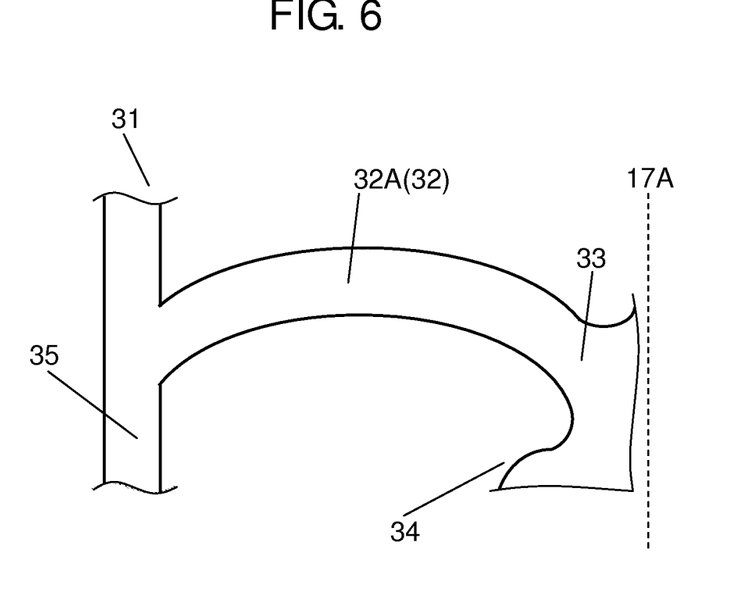
FIG. 6 is a partially enlarged view showing a vibration part of an optical reflecting device in accordance with a second exemplary embodiment of the present invention.

FIG. 6 is a partially enlarged view showing vibration part 32 of optical reflecting device 31 in accordance with a second exemplary embodiment of the present invention. Optical reflecting device 31 includes mirror part 34, joints 33, vibration parts 32, and fixed part 35. Optical reflecting device 31 is different from optical reflecting device 11 of the first exemplary embodiment in that vibration parts 32 have a curvature. The basic configuration except this point is similar to that of optical reflecting device 11. In other words, a pair of joints 33 are disposed at the facing positions on mirror part 34 (not shown). A pair of vibration parts 32 are disposed, and respective central portions of vibration parts 32 are connected to joints 33 (not shown). Both ends of each of vibration parts 32 are connected to fixed part 35. The beam width defined as the length of joints 33 in the direction orthogonal to first axis 17A is greater than the beam width of vibration parts 32.

Each of vibration parts 32 includes a pair of beam parts 32A between the central portion connected to joints 33 and fixed part 35, and beam parts 32A have a curved shape. The beam width of each vibration part 32 is defined as the length between the outer circumference and inner circumference of the curved shape of each beam part 32A.

Each of vibration parts 32 is provided with a driving part (not shown) having a piezoelectric film thereon. When voltage is applied to the piezoelectric film, the piezoelectric film expands or contracts in the plane direction of the piezoelectric film due to an inverse piezoelectric effect, and vibration parts 32 bend in the thickness direction. The bending of each vibration part 32 causes a bending stress near the connection portion between each joint 33 and each vibration part 32. However, beam parts 32A of each vibration part 32 have a curved shape, and hence the stress near the connection portion between each joint 33 and each vibration part 32 can be dispersed. As a result, the mechanical strength is increased, and the deflection angle of mirror part 34 can be increased.

Figure 7A:
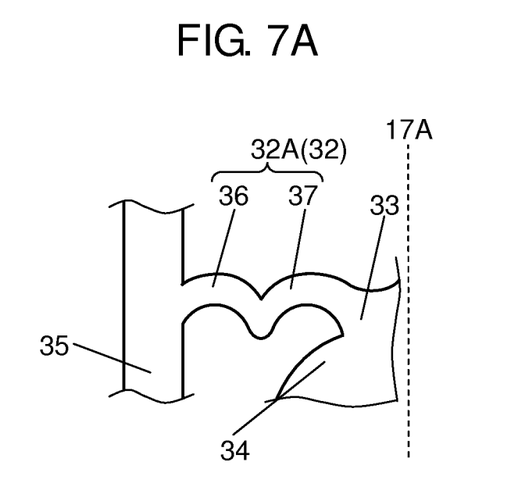
FIG. 7A is a partially enlarged view showing another vibration part of an optical reflecting device in accordance with the second exemplary embodiment of the present invention.
Figure 7B:
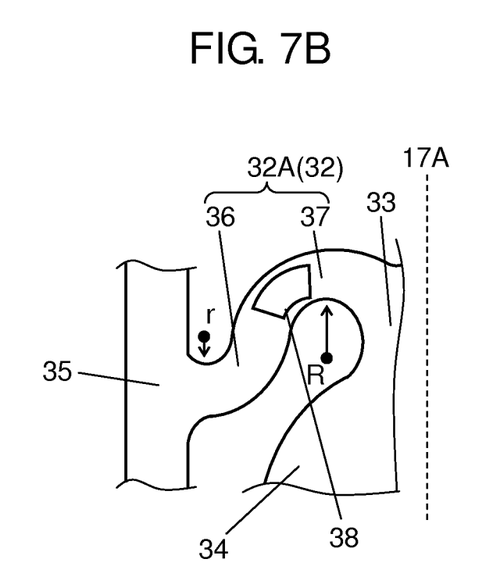
FIG. 7B is a partially enlarged view showing yet another vibration part of an optical reflecting device in accordance with the second exemplary embodiment of the present invention.
Figure 7C:
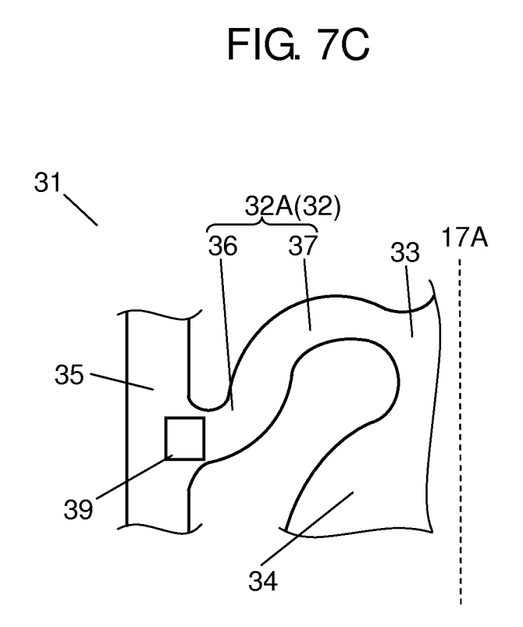
FIG. 7C is a partially enlarged view showing still another vibration part of an optical reflecting device in accordance with the second exemplary embodiment of the present invention.

Next, beam part 32A having a curved shape different from that of FIG. 6 is described with reference to FIG. 7A to FIG. 7C. FIG. 7A to FIG. 7C are partially enlarged views showing other vibration part 32 of the present exemplary embodiment.

In vibration part 32 of each of FIG. 7A to FIG. 7C, beam part 32A includes first curved part 36 closer to fixed part 35, and second curved part 37 closer to the central portion connected to joint 33.

Regarding vibration parts 14 and 15 having a straight shape in the first exemplary embodiment, stress caused by bending of vibration parts 14 and 15 is apt to be concentrated in the connection portions between vibration part 14 or 15 and fixed part 16. On the other hand, first curved part 36 as the connection portion between vibration part 32 and fixed part 35 has a shape having a certain curvature radius as shown in FIG. 7A to FIG. 7C. Therefore, the stress can be dispersed in the connection portion between fixed part 35 and first curved part 36.

Further, as shown in FIG. 7B, the curvature radius of first curved part 36 may be different from that of second curved part 37. Here, the curvature radius of first curved part 36 is denoted with r, and the curvature radius of second curved part 37 is denoted with R.

In order to efficiently cause significant twist in joint 33, it is effective that the amount of the component of the driving part that is orthogonal to joint 33 is increased in the portion nearest to joint 33. In other words, when curvature radius r of first curved part 36 is equal to or larger than curvature radius R of second curved part 37, much of the orthogonal component of the driving part to joint 33 is formed on first curved part 36 apart from joint 33. Therefore, the driving efficiency of causing the twist of joint 33 is decreased.

Therefore, in order that much of the orthogonal component of the driving part to joint 33 is formed on second curved part 37 closer to joint 33, it is preferable that curvature radius r of first curved part 36 be set smaller than curvature radius R of second curved part 37. The magnitude relationship between the curvature radii of first curved part 36 and second curved part 37 can be applied also to vibration part 32 of FIG. 7A.

Piezoelectric body layer 23 (FIG. 2) forming driving part 38 is more preferably disposed on at least second curved part 37 than on first curved part 36. This arrangement enables the twist of joint 33 to be increased efficiently.

When curvature radius r of first curved part 36 is large, the optical reflecting device is extended in the first axis 17A direction with increase in curvature radius r. Therefore, as shown in FIG. 7B, it is preferable that first curved part 36 be set to have a shape that projects toward mirror part 34 along first axis 17A, and second curved part 37 be set to have a shape that projects toward fixed part 35 along first axis 17A. In other words, it is preferable that the curved directions of first curved part 36 and second curved part 37 are different from each other, and first curved part 36 and second curved part 37 project in the opposite directions. Thanks to this shape, the connection position to fixed part 35 can be set at a position close to mirror part 34. Therefore, optical reflecting device 31 can be downsized by the width corresponding to curvature radius r of first curved part 36 while stress is dispersed in the connection portion between fixed part 35 and first curved part 36.

Furthermore, as shown in FIG. 7C, the curvature radius of second curved part 37 may be different between a portion closer to first curved part 36 and a portion closer to joint 33. The bending of vibration part 32 causes a bending stress near the connection portion between joint 33 and vibration part 32. In order to disperse this stress, the curvature radius near the connection portion needs to be increased. The stress applied to the portion of second curved part 37 that is closer to first curved part 36 is relatively small. Therefore, when the curvature radius of second curved part 37 is constant, optical reflecting device 31 is enlarged. When the curvature radius of second curved part 37 on the portion closer to first curved part 36 is set smaller than that on the portion closer to joint 33, optical reflecting device 31 can be downsized while the mechanical strength thereof is maintained.

Piezoelectric film 39 different from a film used for driving may be disposed on first curved part 36, and may also have a function of monitoring the driven state of vibration part 32 simultaneously. Piezoelectric film 39 functions as a monitor part formed in the boundary between fixed part 35 and vibration part 32.

Piezoelectric film 39 has a piezoelectric effect, so that it generates a charge in response to the bending of vibration part 32. As the generated charge amount corresponds to the amount of bending, the driven state of vibration part 32 can be monitored accurately by monitoring the charge. For this purpose, it is required that piezoelectric film 39 is disposed at a position where the driven state of vibration part 32 is detected without disturbing the driving of it and distortion is apt to occur. As vibration part 32 bends, distortion is concentrated around the boundary line between fixed part 35 and first curved part 36. Therefore, it is preferable that piezoelectric film 39 is disposed on at least the boundary line between fixed part 35 and first curved part 36.

Third Exemplary Embodiment

Figure 8:
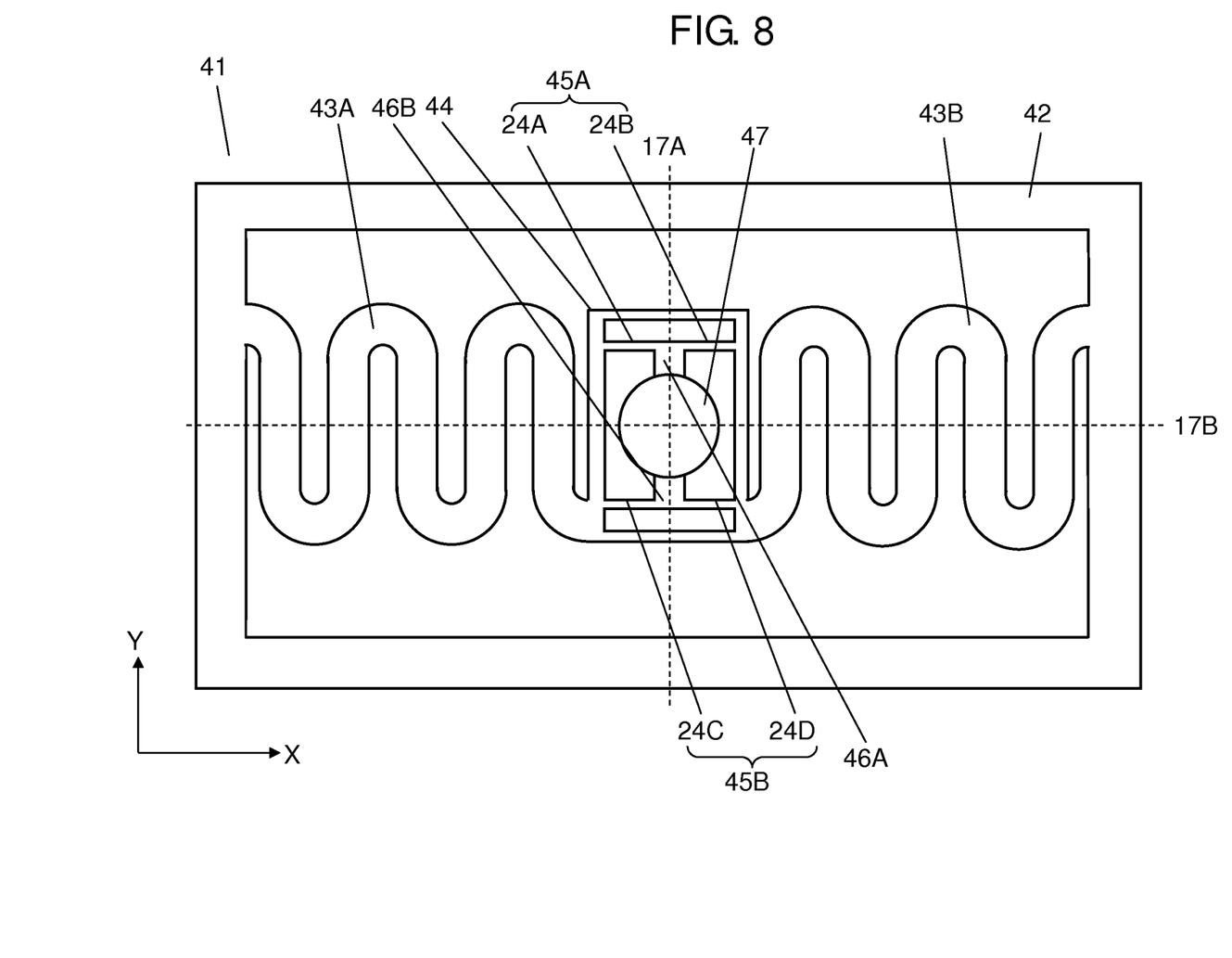
FIG. 8 is a plan view of an optical reflecting device in accordance with a third exemplary embodiment of the present invention.

FIG. 8 is a plan view of optical reflecting device 41 in accordance with a third exemplary embodiment of the present invention. Optical reflecting device 41 includes fixed part 42, a pair of first vibration parts 43A and 43B, movable frame 44, a pair of second vibration parts 45A and 45B, a pair of joints 46A and 46B, and mirror part 47.

The first ends of first vibration parts 43A and 43B are connected to the inside of fixed part 42 so that they face each other, and the second ends thereof are connected to movable frame 44. In other words, first vibration parts 43A and 43B support movable frame 44. Second vibration parts 45A and 45B are connected to both inner sides of movable frame 44, respectively. The inner sides face each other along second axis 17B. First ends of joints 46A and 46B are connected to facing positions on rotatable mirror part 47, and second ends opposite to the first ends are connected to central portions of second vibration parts 45A and 45B, respectively. First vibration parts 43A and 43B rotate movable frame 44 around second axis 17B, and second vibration parts 45A and 45B rotate mirror part 47 around first axis 17A orthogonal to second axis 17B.

Similarly to first and second exemplary embodiments referring FIG. 2, each of first vibration parts 43A and 43B has silicon substrate 18 integrally formed as the lowest layer, and insulating film 19 is formed on silicon substrate 18. Lower electrode film 20 is disposed on insulating film 19, piezoelectric film 21 is disposed on lower electrode film 20, and upper electrode film 22 is disposed on piezoelectric film 21. Lower electrode film 20, piezoelectric film 21, and upper electrode film 22 serve as a driving part.

Figure 9:
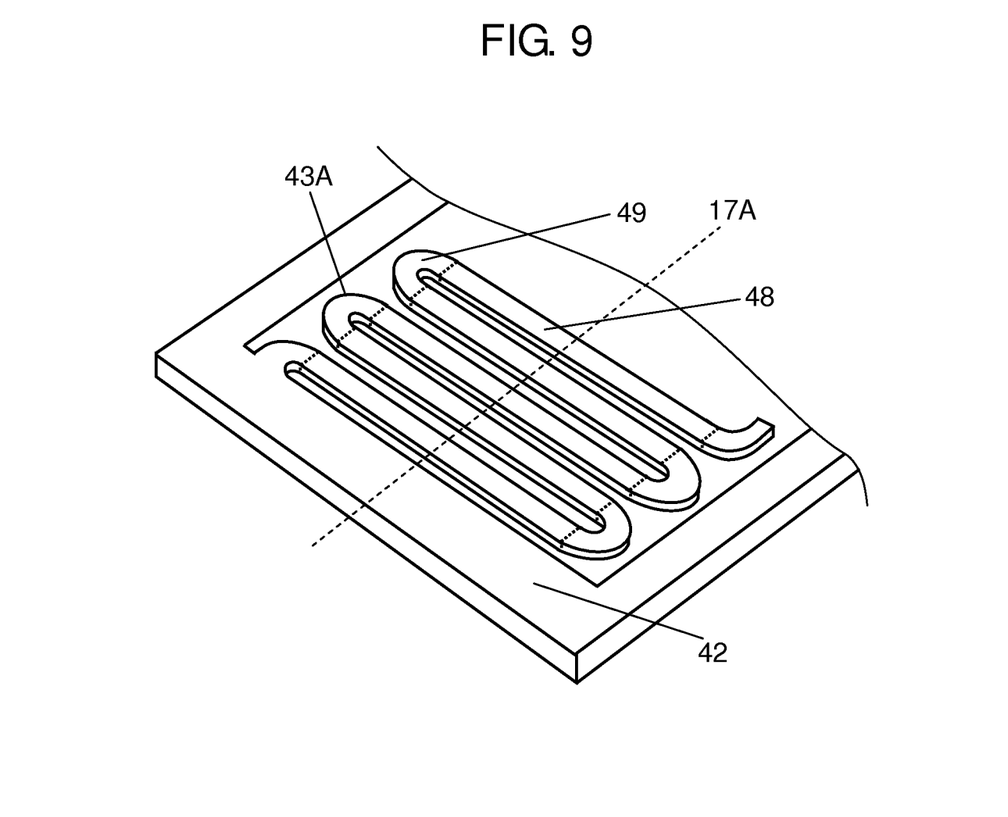
FIG. 9 is an enlarged view showing a vibration part of the optical reflecting device shown in FIG. 8.

FIG. 9 is a partially enlarged view of first vibration part 43A. First vibration part 43A includes a plurality of adjacent coupling portions 48 disposed in parallel, and turning portions 49 connecting two of coupling portions 48. First vibration part 43A is formed in a meandering shape using the plurality of coupling portions 48 and the plurality of turning portions 49. When a predetermined voltage is applied between lower electrode film 20 and upper electrode film 22 of first vibration part 43A, a predetermined electric field is applied to piezoelectric film 21, and piezoelectric film 21 expands or contracts in the plane direction of piezoelectric film 21 due to an inverse piezoelectric effect. At this time, the expansion and contraction operation in the plane direction occurring in piezoelectric film 21 serves as a moment in the thickness direction of first vibration part 43A, and hence first vibration part 43A deflection-vibrates in the thickness direction. At this time, by applying voltages of opposite phases to adjacent coupling portions 48 among coupling portions 48 of first vibration part 43A, the deflections of coupling portions 48 are summed, and movable frame 44 rotates around second axis 17B.

By employing vibration parts 14 and 15 described in the first exemplary embodiment or vibration parts 32 described in the second exemplary embodiment as second vibration parts 45A and 45B, mirror part 47 can rotate by a large displacement simultaneously around first axis 17A and second axis 17B. Therefore, a laser beam or the like is radiated to mirror part 47, and a clear image or the like can be projected on a two-dimensional plane.

INDUSTRIAL APPLICABILITY

An optical reflecting device can project a clear image on a screen, and can be used in a small-sized projector or a head-mounted display.

The invention claimed is:
1. An optical reflecting device comprising: a mirror part;
a pair of joints each having a first end connected to respective one of facing positions to each other on the mirror part, and a second end opposite to the first end, and extending along a first axis;
a pair of vibration parts each having a central portion connected to the second end of respective one of the joints, and extending along a second axis orthogonal to the first axis;
a plurality of driving parts disposed in each of the pair of vibration parts and configured to rotate the mirror part; and
a fixed part directly connected to both ends of each of the pair of vibration parts, wherein each of the pair of vibration parts linearly extends across the both ends directly connected to the fixed part, a beam width of each of the joints is greater than a beam width of each of the pair of vibration parts, where the beam width of each of the joints is defined as a length along the second axis and the beam width of each of the pair of vibration parts is defined as a length along the first axis.

2. The optical reflecting device according to claim 1, wherein each of the pair of vibration parts includes a pair of beam parts between the central portion connected to each of the joints and the fixed part, each of the pair of beam parts has a curved shape, and the beam width of each of the pair of vibration parts is defined as a length between an outer circumference and an inner circumference of the curved shape.

3. The optical reflecting device according to claim 2, wherein each of the beam parts is formed of a first curved part closer to the fixed part and a second curved part closer to the central portion.

4. The optical reflecting device according to claim 3, wherein a curvature radius of the first curved part is smaller than a curvature radius of the second curved part.

5. The optical reflecting device according to claim 4, wherein the curvature radius of the second curved part is different at a side closer to the first curved part from at a side closer to each of the joints.

6. The optical reflecting device according to claim 3, wherein a curved direction of the first curved part is different from a curved direction of the second curved part.

7. The optical reflecting device according to claim 6, wherein a curvature radius of the first curved part is smaller than a curvature radius of the second curved part.

8. The optical reflecting device according to claim 7, wherein the curvature radius of the second curved part is different at a side closer to the first curved part from at a side closer to each of the joints.

9. The optical reflecting device according to claim 3, wherein each of the driving parts is formed on the second curved part.

10. The optical reflecting device according to claim 1, wherein each of the driving parts is formed by sequentially stacking a lower electrode film, a piezoelectric film, and an upper electrode film.

11. The optical reflecting device according to claim 1, wherein a monitor part is formed in a boundary between the fixed part and each of the vibration parts.

12. The optical reflecting device according to claim 1, wherein the beam width of each of the joints is greater than a beam thickness of each of the joints, the beam thickness being defined as a length of each of the joints in a direction orthogonal to a plane formed of the first axis and a second axis orthogonal to the first axis.

* * * * *